US012099667B1

(12) United States Patent
Zannier et al.

(10) Patent No.: US 12,099,667 B1
(45) Date of Patent: Sep. 24, 2024

(54) FORCE SENSING TOUCHPAD

(71) Applicant: Microsoft Technology Licensing, LLC, Redmond, WA (US)

(72) Inventors: Federico Zannier, Seattle, WA (US); Lalit Anil Palve, Seattle, WA (US); Rhishikesh Ashok Sathe, Bothell, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/320,926

(22) Filed: May 19, 2023

(51) Int. Cl.
*G06F 3/0354* (2013.01)
*G01L 1/14* (2006.01)
*G06F 3/044* (2006.01)

(52) U.S. Cl.
CPC ............ *G06F 3/03547* (2013.01); *G01L 1/14* (2013.01); *G06F 3/044* (2013.01)

(58) Field of Classification Search
CPC ......... G06F 3/03547; G06F 3/044; G01L 1/14
See application file for complete search history.

(56) References Cited

U.S. PATENT DOCUMENTS

| | | | | |
|---|---|---|---|---|
| 9,229,592 B2 * | 1/2016 | Bulea | ................. | G06F 3/04142 |
| 9,671,898 B2 * | 6/2017 | Hsieh | .................... | G06F 3/0447 |
| 10,068,728 B2 * | 9/2018 | Huska | .................... | H01H 13/85 |
| 10,133,377 B2 * | 11/2018 | Kim | ....................... | G06F 3/0446 |
| 10,459,542 B1 * | 10/2019 | Costante | ................ | H05K 7/142 |
| 10,866,642 B2 * | 12/2020 | Rosenberg | ............ | G06F 3/0416 |
| 11,726,597 B1 * | 8/2023 | Peretz | ................... | G06F 3/0443 |
| | | | | 345/173 |
| 11,768,542 B1 * | 9/2023 | Dani | ....................... | G06F 3/016 |
| | | | | 345/174 |

(Continued)

FOREIGN PATENT DOCUMENTS

| | | |
|---|---|---|
| EP | 1840715 A2 | 10/2007 |
| KR | 101939280 B1 | 1/2019 |

OTHER PUBLICATIONS

"Capacitive Touch Hardware Design and Layout Guidelines for Synergy, RX200, and RX100", Retrieved from: https://www.renesas.com/in/en/document/apn/capacitive-touch-hardware-design-and-layout-guidelines-synergy-rx200-and-rx100-application-note?language=en, Jun. 14, 2017, 20 Pages.

(Continued)

*Primary Examiner* — Grant Sitta
(74) *Attorney, Agent, or Firm* — Alleman Hall & Tuttle LLP

(57) ABSTRACT

Force sensing touchpads and related computing devices are disclosed. In one example, a force sensing touchpad comprises a printed circuit board (PCB) comprising a plurality of PCB electrodes. A base plate is spaced from the PCB and defines an aperture. A spring is mounted on the base plate overlying the aperture in the base plate. The spring comprises a plurality of spring electrodes, a first beam extending from a first internal wall to a first side of a central portion that overlies the aperture, and a second beam extending from a second internal wall that is opposite the first internal wall to a second side of the central portion that is opposite to the first side. A spacer located between the PCB and the central portion of the spring. Each of the PCB electrodes is spaced from and overlies one of the spring electrodes of the spring.

20 Claims, 11 Drawing Sheets

(56) References Cited

U.S. PATENT DOCUMENTS

| | | | |
|---|---|---|---|
| 2006/0012944 A1* | 1/2006 | Mamigonians | G06K 7/081 |
| | | | 361/303 |
| 2009/0260897 A1 | 10/2009 | Kruse | |
| 2011/0011650 A1 | 1/2011 | Klinghult | |
| 2014/0307207 A1 | 10/2014 | Ge et al. | |
| 2015/0130730 A1* | 5/2015 | Harley | G06F 3/016 |
| | | | 345/173 |
| 2015/0198844 A1 | 7/2015 | Choi et al. | |
| 2016/0378259 A1 | 12/2016 | Schediwy et al. | |
| 2017/0153737 A1 | 6/2017 | Chawda et al. | |
| 2017/0249049 A1 | 8/2017 | Wang et al. | |
| 2017/0336904 A1* | 11/2017 | Hsieh | G06F 3/0412 |
| 2018/0188843 A1 | 7/2018 | Wang et al. | |
| 2018/0190722 A1 | 7/2018 | Lai et al. | |
| 2019/0212842 A1* | 7/2019 | Hinson | H04M 1/02 |
| 2020/0064952 A1 | 2/2020 | Gupta et al. | |
| 2020/0150767 A1* | 5/2020 | Karimi Eskandary | |
| | | | H04M 1/0202 |
| 2020/0278747 A1* | 9/2020 | Ligtenberg | G06F 3/0446 |
| 2021/0278966 A1* | 9/2021 | Rosenberg | G06F 3/045 |
| 2022/0164102 A1 | 5/2022 | Rosenberg et al. | |
| 2022/0350429 A1 | 11/2022 | Ghioni et al. | |

OTHER PUBLICATIONS

"Design with Surface Sensors for Touch Sensing Applications on MCUs", Retrieved from: https://www.st.com/resource/en/application_note/dm00087990-design-with-surface-sensors-for-touch-sensing-applications-on-mcus-stmicroelectronics.pdf, Aug. 2021, 32 Pages.

"Non Final Office Action Issued in U.S. Appl. No. 17/827,115", Mailed Date: Nov. 10, 2022, 7 Pages.

"Notice of Allowance Issued in U.S. Appl. No. 17/827,115", Mailed Date: Mar. 15, 2023, 10 Pages.

Suen, et al., "Capacitive Tactile Sensor with Concentric-Shape Electrodes for Three-Axial Force Measurement", in Publication of MDPI, Dec. 19, 2018, 5 Pages.

"International Search Report and Written Opinion Issued in PCT Application No. PCT/US23/015986", Mailed Date: Jun. 28, 2023, 12 Pages.

* cited by examiner

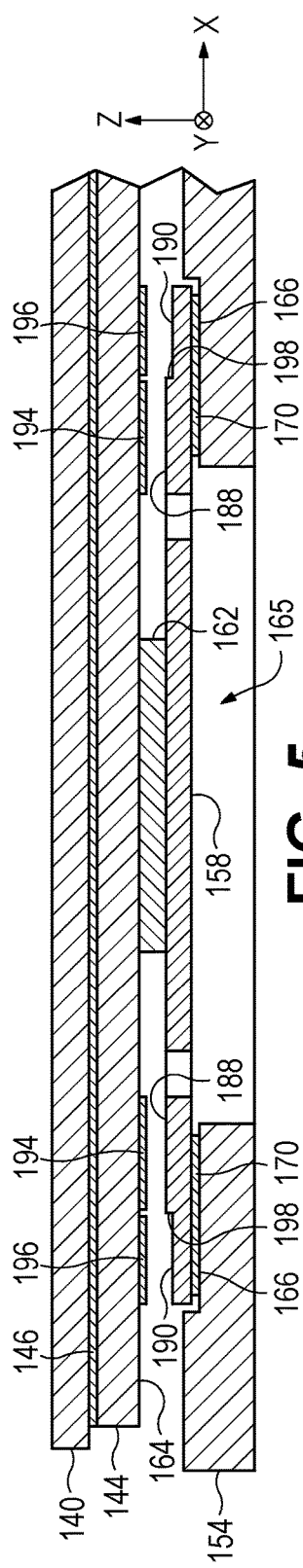
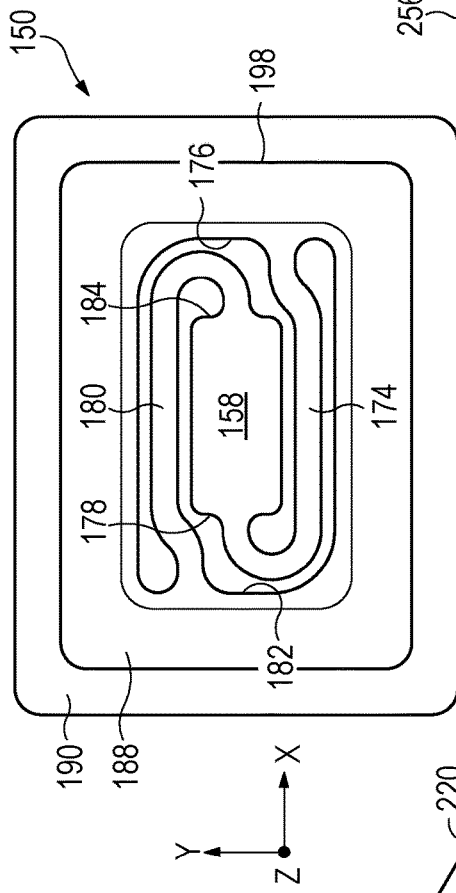
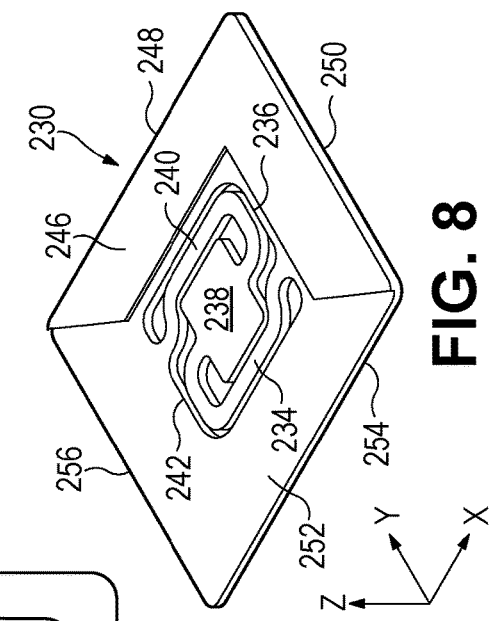
FIG. 5
FIG. 6
FIG. 7
FIG. 8

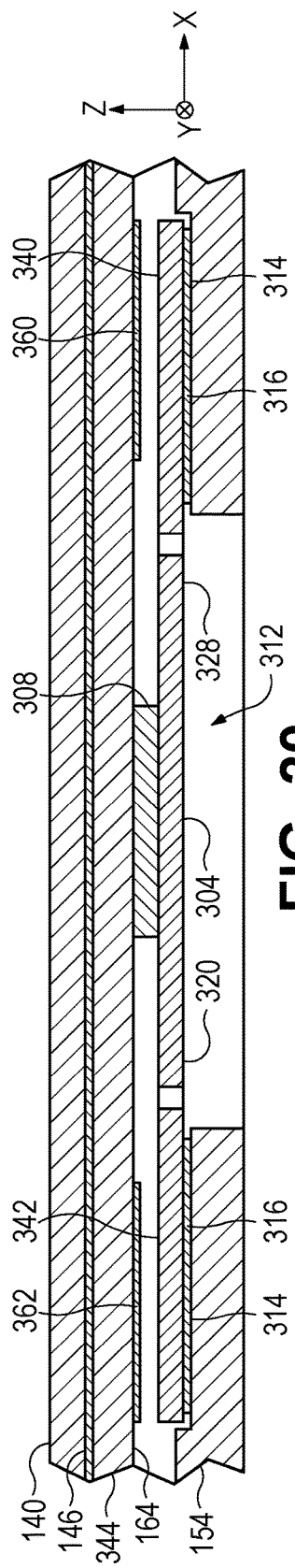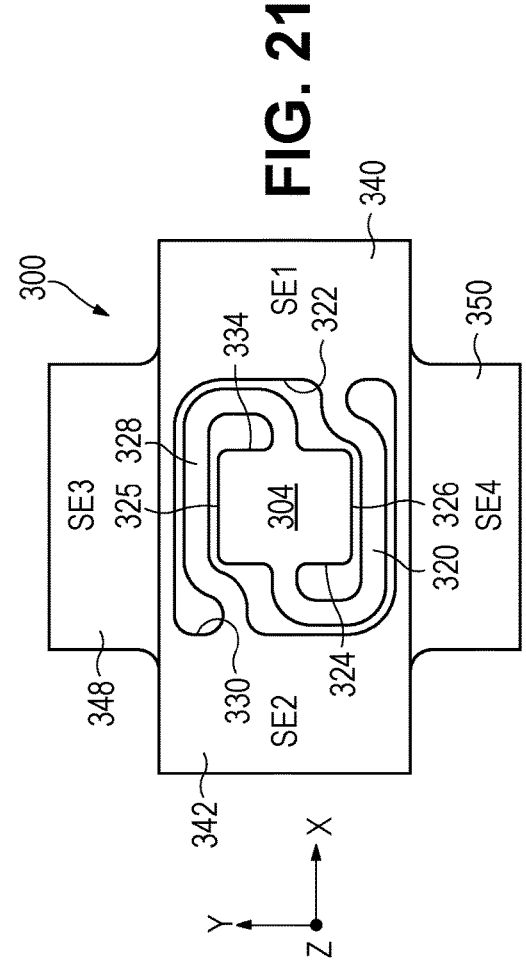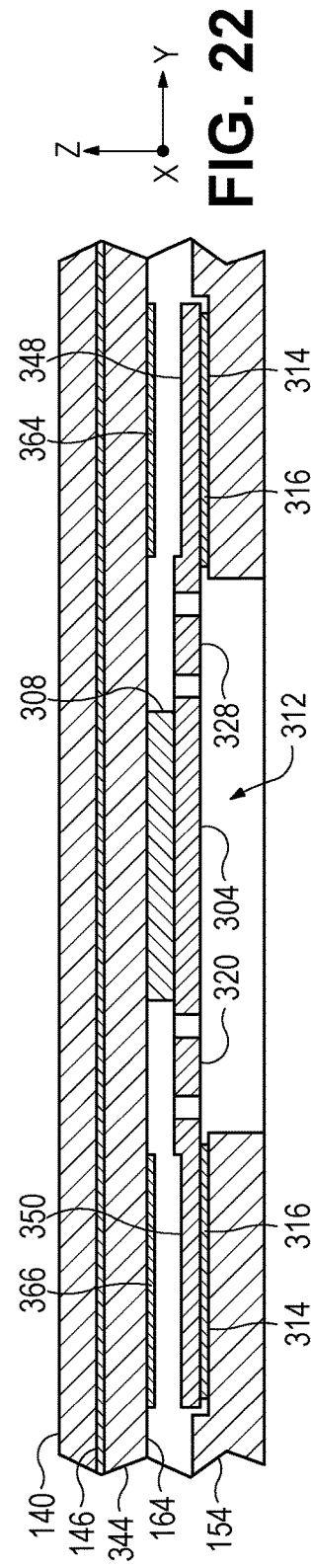

FORCE SENSING TOUCHPAD

BACKGROUND

Some computing devices include a force sensing touchpad for receiving user inputs. In some of these devices, the touchpad utilizes capacitance measurements to estimate a force applied to the touchpad.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed relating to force sensing touchpads and related computing devices. In some examples, a force sensing touchpad for a computing device comprises a printed circuit board (PCB) comprising a plurality of PCB electrodes. A base plate is spaced from the PCB and defines an aperture. A spring is mounted on the base plate overlying the aperture in the base plate. The spring comprises a plurality of spring electrodes, a first beam extending from a first internal wall to a first side of a central portion that overlies the aperture, and a second beam extending from a second internal wall that is opposite the first internal wall to a second side of the central portion that is opposite to the first side. A spacer located between the PCB and the central portion of the spring. Each of the PCB electrodes is spaced from and overlies one of the spring electrodes of the spring.

BRIEF DESCRIPTION OF THE DRAWINGS

FIG. 5 is a schematic cross section of the touchpad of FIG. 3 taken along line 5-5.

FIG. 6 is a top view of one spring of the touchpad.

FIG. 7 shows another example of a spring for a touchpad according to examples of the present disclosure.

FIG. 8 shows another example of a spring for a touchpad according to examples of the present disclosure.

FIG. 20 is a schematic cross section of the touchpad of FIG. 18 taken along line 20-20.

FIG. 21 is a top view of one spring of the touchpad of FIG. 18.

FIG. 22 is a schematic cross section of the touchpad of FIG. 18 taken along line 22-22.

DETAILED DESCRIPTION

Figure 1:
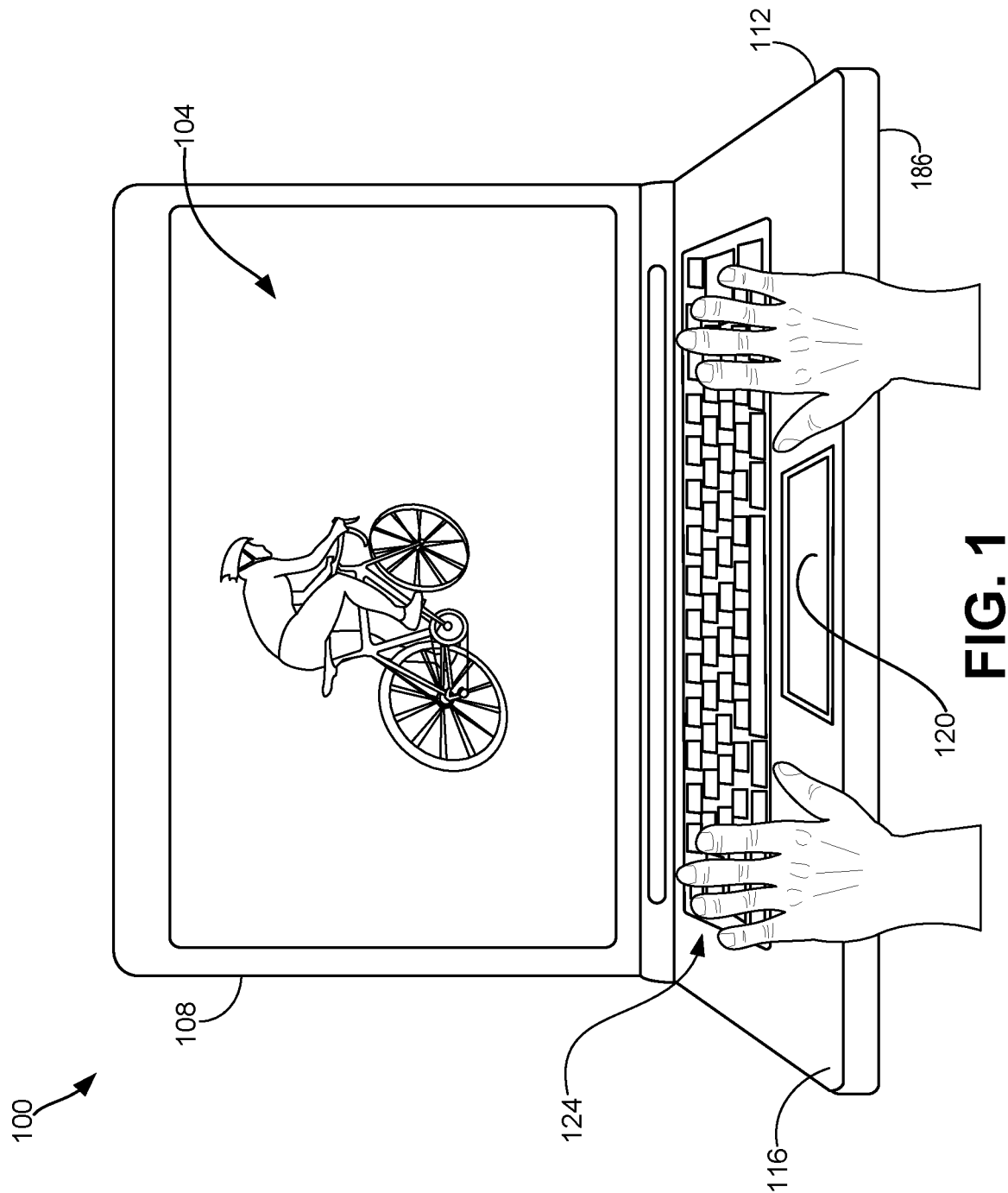
FIG. 1 shows one example of a computing device utilizing a touchpad according to examples of the present disclosure.

Some computing devices include a touchpad for receiving user inputs. In some of these devices, the touchpad utilizes capacitance measurements to estimate a force applied to the touchpad. For example, in some devices a printed circuit board (PCB) is configured on a cover glass assembly and supported by one or more cantilever springs over a bucket connected to electrical ground. One or more sensing pads (electrodes) are located between the PCB and the bucket. In such implementations, the capacitance between the sensing pads and the grounded bucket is a function of the distance between the sensing pads and the bucket.

In these examples, a capacitive force transducer can utilize displacement as a proxy for force. In such a parallel plate capacitor model, the capacitance is equal to the area of the electrode divided by the distance between the sensing pads and the bucket. When a force applied to the cover glass assembly compresses the spring and reduces this distance, the capacitance changes. In this model, the capacitance is directly proportional to the applied force.

In one example, where the area of an electrode is represented by $A_{pad}$, the initial distance between the electrode and the bucket is $d_0$, and the change in the distance as a result of a force F applied by a user is $d(F)=F/K$, the capacitance as a result of the Force F is given by the equation:

$$\text{Capacitance (Force)} = \varepsilon \frac{A_{pad}}{d_0 - d(F)} = \varepsilon \frac{A_{pad}}{d_0 - \frac{F}{K}},$$

where K is the spring constant of the spring between the PCB and the bucket, F is the force applied by the user on the touchpad, and $\varepsilon$ is the permittivity of the medium in the gap between the electrode and the bucket. In this manner, a measured change in capacitance can be used to calculate the magnitude of the applied force F.

However, devices with capacitive force transducers can utilize components such as PCBs, buckets, and other structures that can bend under applied forces. Component aging, environmental factors, and manufacturing variabilities also can affect a component's bending behavior. Such component bending can introduce errors in the calculation of the force F using a parallel plate capacitor model as discussed above.

Accordingly, and as described in more detail below, configurations of the present disclosure provide touchpad configurations and related components that reduce or substantially eliminate component bending and corresponding errors in force calculations. As described in more detail below, touchpads and computing devices of the present disclosure utilize spring and electrode configurations that reduce bending errors between PCB electrodes and spring electrodes on a corresponding spring. Additionally, configurations of the present disclosure reduce the packaging space required by the capacitive force transducers by combining the spring electrodes and resilient spring structures in the same footprint of the spring. In some examples, the spring electrodes are integral portions of the spring itself, thereby advantageously enabling a "bucket-less" design that does not utilize or require the structural rigidity of a conductive metal bucket. These examples also advantageously reduce the tolerance chain between spring electrodes and PCB.

With reference now to FIGS. 1-4 and 24, an example computing device 100 in the form of a laptop computer that includes one example of a force sensing touchpad according to aspects of the present disclosure is illustrated. In other examples, force sensing touchpads of the present disclosure can be implemented in tablet computing devices, foldable computing devices including multiple touch screens, wearable and other mobile computing devices, and any other type of computing device that utilizes a touchpad.

In this example computing device 100 includes a touch screen display 104 on a display substrate 108 that is rotatably coupled to a chassis 112. The chassis 112 includes a user interaction surface 116 that comprises a force sensing touchpad 120 and keyboard 124, and an opposing rear cover 186. In different examples a user provides touch inputs to the touchpad 120 by touching the touchpad with one or more digits of the user's hand.

Touchpad 120 is configured to detect the position and force of a user's finger(s) and/or thumb. In some examples the touchpad 120 is a mutual capacitance touchpad. In these examples, touch inputs are identified by sampling capacitance between a driving electrode and a sensing electrode. Driving electrodes are arranged in an array within the touchpad 120. Touch detection signals are provided to each of the electrodes at a different frequency and/or at a different time. Conductive materials, such as a user's finger, draw current away from the driving electrodes when providing a touch input. The touch input can be identified by detecting this current, and a location of the touch input can be reconstructed based at least in part on determining which driving electrodes were being driven when the touch input occurred, and the frequency of the touch detection signal driving each driving electrode. In other examples, touchpads employing other touch detection technologies, including but not limited to self-capacitance and projected capacitance touch detection, can be utilized.

Figure 2:
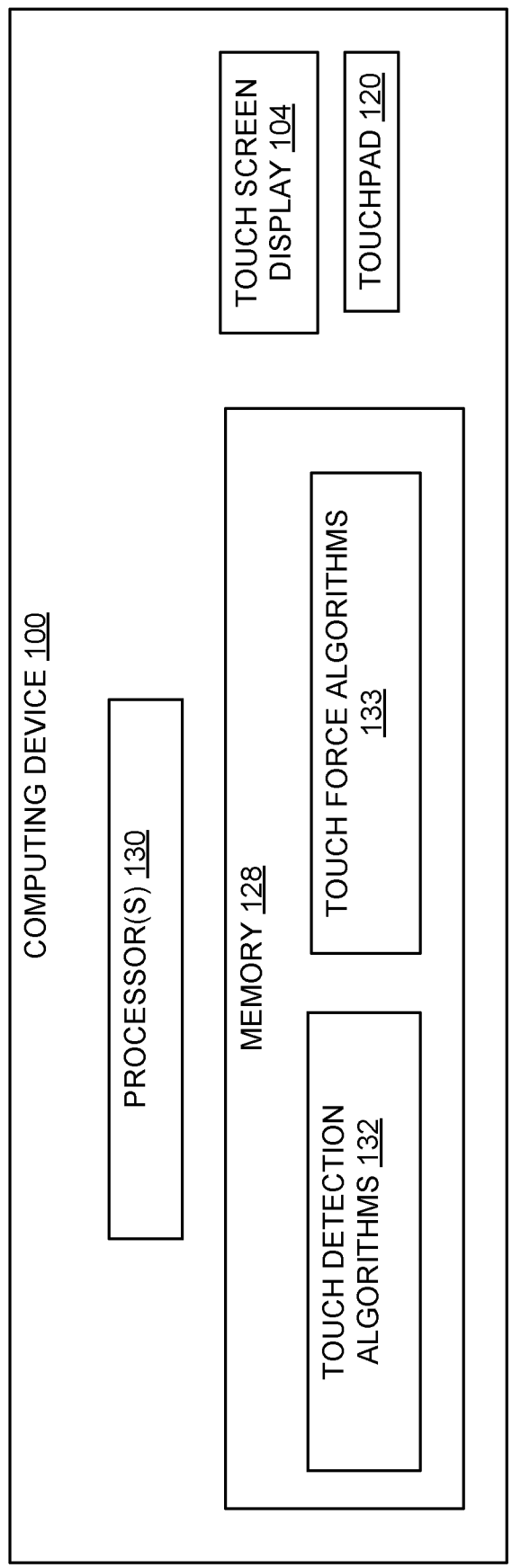
FIG. 2 shows a schematic view of components of the computing device of FIG. 1 according to examples of the present disclosure.
Figure 3:
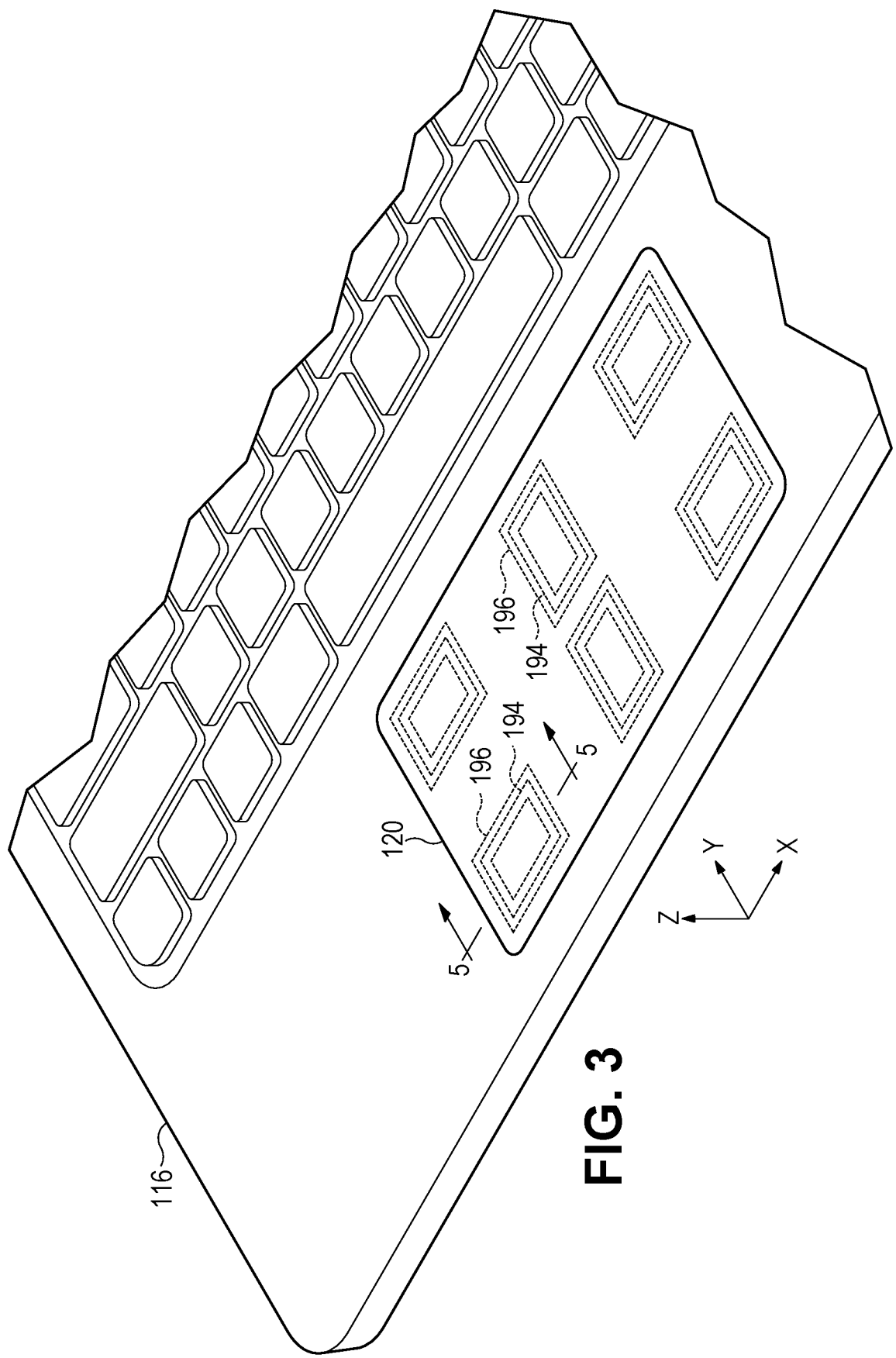
FIG. 3 shows a partial view of the computing device of FIG. 1.

With reference now to FIG. 2, a schematic view of selected components of the example computing device 100 of FIG. 1 is provided. Computing device 100 includes memory 128 that stores instructions executable by a processor 130. For example, the memory 128 stores instructions in the form of touch detection algorithms 132 executable by the processor 130 to perform touch detection on the touchpad 120 using signals received from the touchpad. Similarly, memory 128 stores instructions in the form of touch force algorithms 133 executable by the processor 130 to determine the force of a touch input on the touchpad 120. Additional details regarding memory 128, processor 130, and other components and subsystems of computing device 100 are described further below with reference to FIG. 24.

With reference now to FIGS. 3-6, in one example the touchpad 120 includes a cover glass layer 140 affixed to a PCB 144 by an adhesive layer 146. The PCB 144 is supported by a plurality of springs 150 located on a base plate 154. In different examples the base plate can comprise a conductive material such as aluminum, a non-conductive material such as plastic, or combinations of the foregoing. In this example, the touchpad 120 utilizes six springs 150 to support the PCB 144 and provide capacitive force sensing as described further below. In other examples, touchpads of the present disclosure can utilize fewer or more springs.

With reference to the simplified cross section illustrated in FIG. 5, and as described in more detail below, each spring 150 comprises a central portion 158 that is resiliently supported by two beams extending from opposing internal walls of the spring. A spacer 162 is located between the central portion 158 and a lower metal layer 164 of the PCB 144, and is bonded to the central portion and/or the PCB 144. In some examples, the spacer 162 comprises a silicone bump that includes an embedded conductive bead that provides grounding of the spring 150 to facilitate capacitive measurements.

Figure 4:
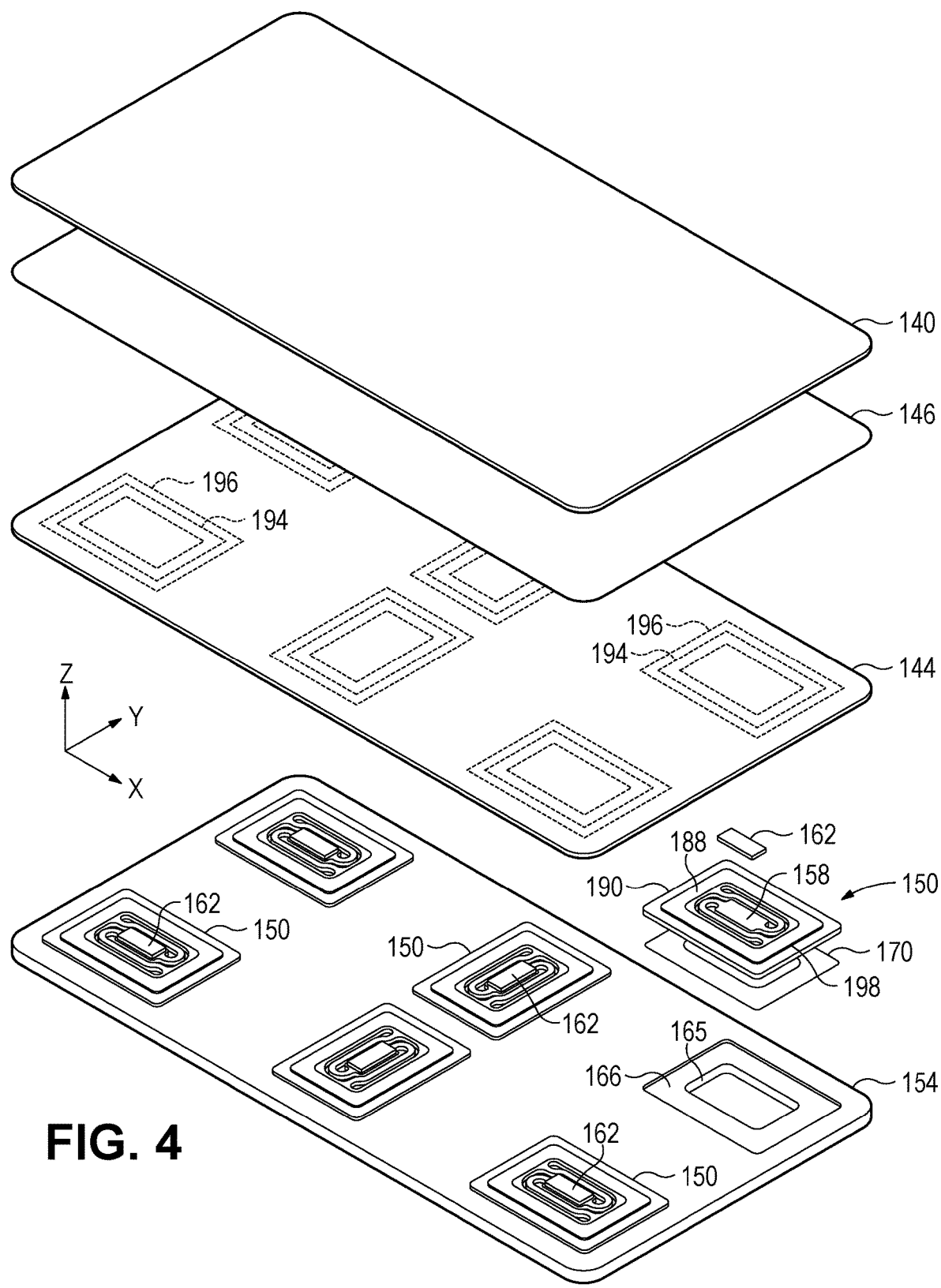
FIG. 4 shows an exploded view of the touchpad.
Figure 9:
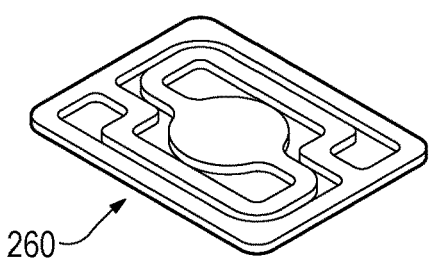
FIGS. 9-17 show other examples of springs for a touchpad according to examples of the present disclosure.
Figure 10:
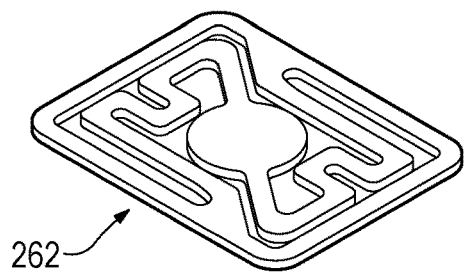
Figure 11:
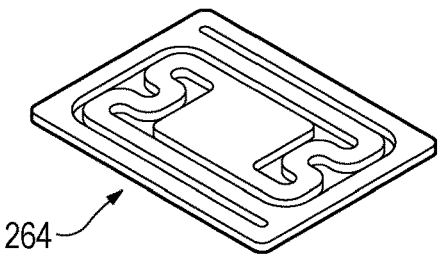
Figure 12:
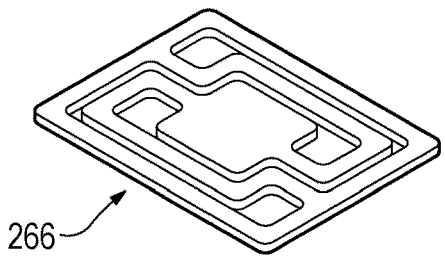
Figure 13:
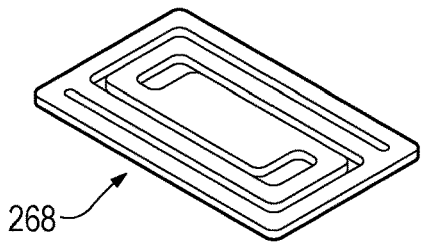
Figure 14:
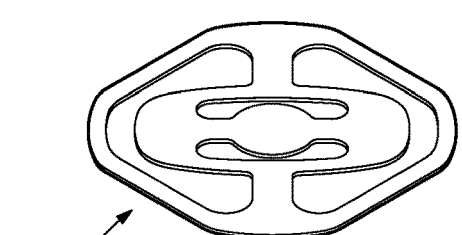
Figure 15:
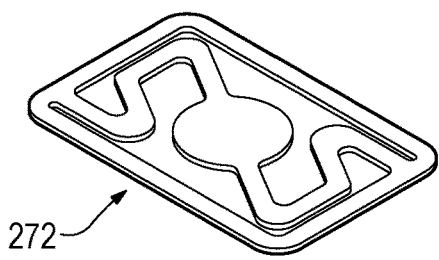
Figure 16:
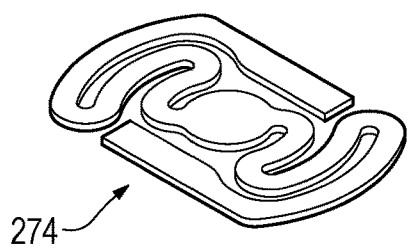
Figure 17:
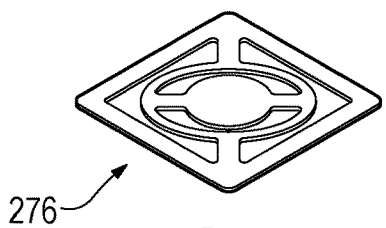
Figure 18:
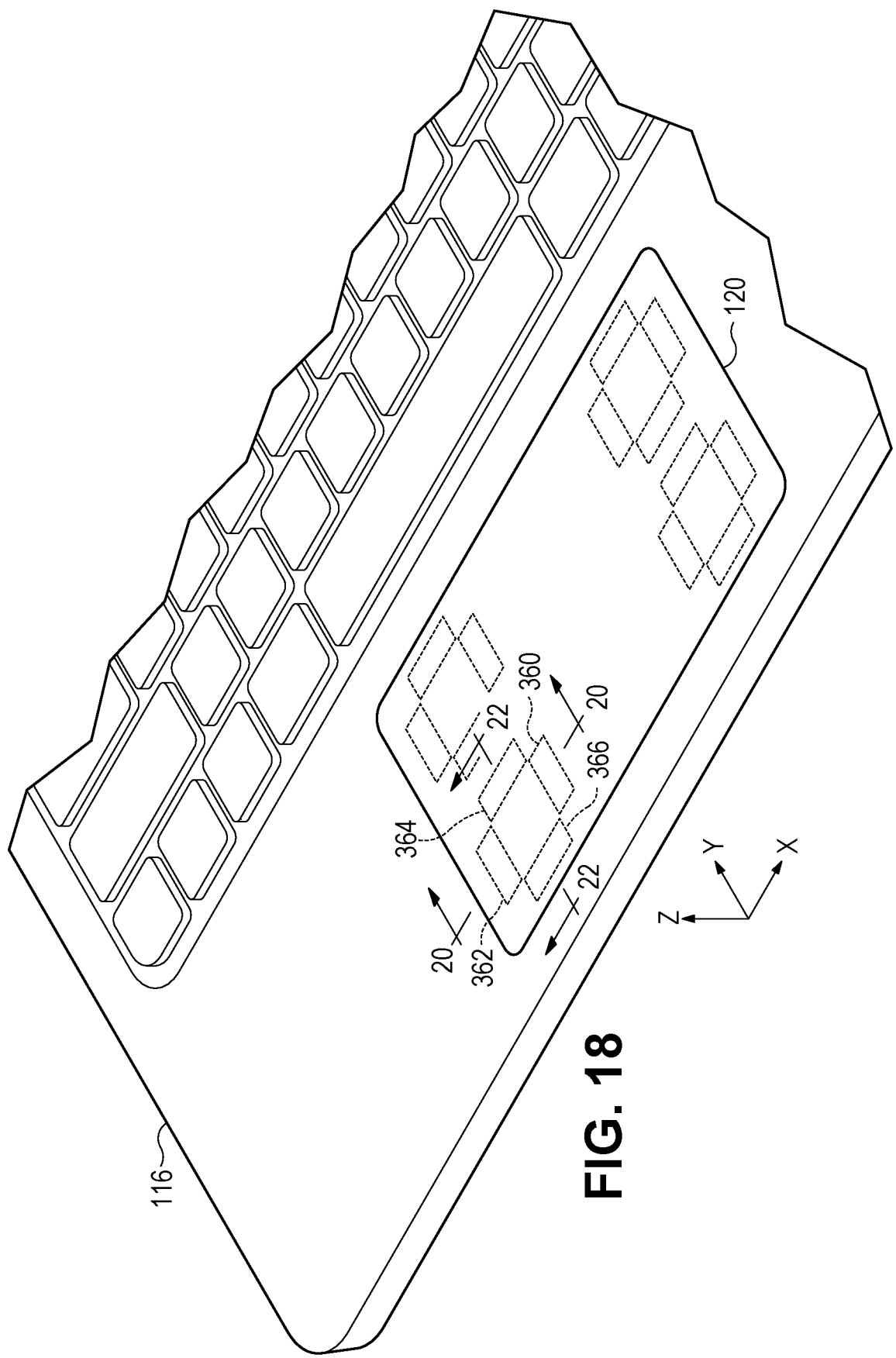
FIG. 18 shows a partial view of a computing device and touchpad according to another example of the present disclosure.

The base plate 154 defines six apertures 165 that each correspond to one of the springs 150. As shown in FIGS. 4 and 5, at each aperture 165 the base plate 154 comprises a recessed shelf 166 that surrounds the aperture. A spring 150 is affixed to the recessed shelf 166 of the base plate 154 via a spring adhesive layer 170. As best seen in FIG. 5, the central portion 158 of the spring 150 is positioned over a corresponding aperture 165 in the base plate 154. In this manner, each spring 150 resiliently supports the PCB 144 in a manner that enables the PCB to move in the z-axis direction in response to a force exerted on the cover glass layer 140.

In the present example and with reference to FIG. 6, each spring 150 comprises a first beam 174 extending from a first internal wall 176 to a first side 178 of the central portion 158 of the spring. In this example, the first beam 174 initially extends in the negative x-axis direction before curving approximately 180 degrees to extend in the positive x-axis direction into the first side 178 of the central portion 158. Each spring 150 also comprises a second beam 180 extending from a second internal wall 182 opposite the first internal wall 176 to a second side 184 of the central portion 158 opposite to the first side 178. The second beam 180 initially extends in the positive x-axis direction before curving approximately 180 degrees to extend in the negative x-axis direction into the second side 184 of the central portion 158.

In one potential advantage of the present disclosure, each spring 150 comprises a plurality of spring electrodes within the footprint of the spring structure. As described further below, each spring electrode is spaced from an overlying PCB electrode located on the lower metal layer 164 of PCB 144 to enable capacitive force sensing utilizing displacements of the PCB 144 in response to user touches applied to the touchpad 120. In the present example, each spring 150 comprises an inner rectangular spring electrode 188 and an outer rectangular spring electrode 190 surrounding and concentric with the inner rectangular spring electrode. With reference to FIG. 5, in this example the inner rectangular spring electrode 188 and the outer rectangular spring electrode 190 are affixed to the recessed shelf 166 of the base plate 154 via adhesive layer 170.

Advantageously, by affixing the inner rectangular spring electrode 188 and outer rectangular spring electrode 190 to the recessed shelf 166 of the base plate 154 and supporting the PCB 144 at the central portion 154 of the spring 150 that is interior to the two spring electrodes, bending errors between the PCB electrodes (described further below) and the spring electrodes are reduced or substantially eliminated. Additionally, configurations of the present disclosure reduce the packaging space required by the capacitive force transducers by combining the spring electrodes and resilient spring structures in the same footprint of the spring.

Additionally, in another potential advantage of this example, the inner rectangular spring electrode 188 and the outer rectangular spring electrode 190 are integral portions of the spring 150. Alternatively expressed, the spring 150 and each of its components are fabricated from one continuous workpiece of material, such as copper. In different examples, spring 150 can be fabricated via metalworking processes, additive manufacturing processes, or any other suitable process. As noted above, in one potential advantage of this configuration, providing the inner rectangular spring electrode 188 and outer rectangular spring electrode 190 as integral portions of the spring 150 advantageously enables a "bucket-less" design that does not utilize or require the structural rigidity of a metal bucket. This configuration also reduces the tolerance chain between these spring electrodes and corresponding PCB electrodes on the PCB 144 as described further below.

In other examples, the inner rectangular spring electrode 188 and the outer rectangular spring electrode 190 can be separate components that are affixed to the spring 150.

As described in more detail below, the PCB 144 includes a plurality of PCB electrodes that are each spaced from and overlying one of the spring electrodes of the spring 150. In the present example and with reference to FIGS. 4 and 5, the plurality of PCB electrodes comprise an inner rectangular PCB electrode 194 and an outer rectangular PCB electrode 196 surrounding and concentric with the inner rectangular PCB electrode. Accordingly and as shown in FIG. 5, the inner rectangular PCB electrode 194 is spaced from and overlies the inner spring electrode 188, and the outer rectangular PCB electrode 196 is spaced from and overlies the outer spring electrode 190.

As shown in FIGS. 4 and 5, in this example the outer spring electrode 190 of each spring 150 is stepped down in the z-axis direction with respect to the inner spring electrode 188. More particularly, in this example a step 198 delineates a rectangular boundary between the inner spring electrode 188 and the outer spring electrode 190. In this manner and as illustrated in FIG. 5, a first distance between the inner spring electrode 188 and the inner PCB electrode 194 is less than a second distance between the outer spring electrode 190 and the outer PCB electrode 196. With this configuration, a differential capacitive force sensing technique can be utilized to enable self-calibration of the touchpad 150 over the life of the computing device 100 to accommodate changes over time in a base height do between the PCB 144 and the base plate 154.

In this example, because the first distance between the inner spring electrode 188 and the inner PCB electrode 194 is different from the second distance between the outer spring electrode 190 and the outer PCB electrode 196, the capacitance between the inner spring electrode 188 and the inner PCB electrode 194 is also different from the outer spring electrode 190 and the outer PCB electrode 196. This differential capacitance between the two pairs of electrodes can be used to calibrate the base height do of the touchpad 120 over the life of the touchpad 120, regardless of changes in the base height do from its initial value. Accordingly and in another potential advantage, utilizing such differences in distance between corresponding spring and PCB electrodes enables periodic calibration of the base height do to correct for changes over time.

In other examples, touchpads of the present disclosure can utilize other configurations of springs and spring electrodes. In each of these configurations, like the spring 150 described above, by affixing the spring electrodes to the recessed shelf 166 of the base plate 154 and supporting the PCB 144 at a central portion of the spring that is interior to the spring electrodes, bending errors between the PCB electrodes and the spring electrodes are reduced or substantially eliminated. Additionally, these configurations similarly reduce the packaging space required by the capacitive force transducers by combining the spring electrodes and resilient spring structures in the same footprint of the spring. Additionally, the spring electrodes in these configurations can be integral portions of the spring.

With reference now to FIG. 7, in this example a spring 200 comprises a first beam 204 extending from a first internal wall 206 to a first side of the central portion 210 of the spring. In this example, the first beam 204 initially extends in the negative x-axis direction before curving approximately 90 degrees upwardly to extend in the y-axis direction along a second internal wall 216, then curving approximately 90 degrees to extend in the positive x-axis direction into the central portion 210. Each spring 200 also comprises a second beam 214 extending from a second internal wall 216 opposite the first internal wall 206 to a second side of the central portion 210 opposite to the first side. The second beam 214 initially extends in the positive x-axis direction before curving approximately 90 degrees downwardly to extend in the negative y-axis direction along the first internal wall 206, then curving approximately 90 degrees to extend in the negative x-axis direction into the second side of the central portion 210.

In this example, spring 200 comprises a first spring electrode 220 on a first side of the spring and a second spring electrode 224 on a second side of the spring opposite to the first side, with the second spring electrode being coplanar with the first spring electrode. With this configuration of coplanar electrodes, a standard capacitive force sensing technique as described above can be utilized. Additionally and in one potential advantage of this configuration, utilizing coplanar spring electrodes can reduce a z-height of the spring 200 to provide a more space-efficient structure.

With reference now to FIG. 8, in this example a spring 230 also comprises a first beam 234 extending from a first internal wall 236 to a first side of the central portion 238 of the spring. In this example, the first beam 234 initially extends in the negative x-axis direction before curving approximately 90 degrees upwardly to extend in the y-axis direction, then curving approximately 90 degrees to extend in the positive x-axis direction into the central portion 238. Each spring 230 also comprises a second beam 240 extending from a second internal wall 242 opposite the first internal wall 236 to a second side of the central portion 238 opposite to the first side. The second beam 240 initially extends in the positive x-axis direction before curving approximately 90 degrees downwardly to extend in the negative y-axis direction, then curving approximately 180 degrees to extend in the negative x-axis direction into the second side of the central portion 238.

In this example, spring 230 comprises a first L-shaped spring electrode 246 extending along a first side 248 and an adjoining third side 250 of the spring 230 and a second L-shaped spring electrode 252 extending along a second side 254 and an adjoining fourth side 256 of the spring. In this configuration, the first L-shaped spring electrode 246 is slightly elevated with respect to the second L-shaped spring electrode 252 to enable differential capacitive force sensing techniques to be utilized.

In other examples, any suitable number of springs and corresponding apertures in a base plate, as well as different configurations of spring electrodes and corresponding PCB electrodes that incorporate aspects of the present disclosure, can be utilized in touchpads of the present disclosure.

In other examples, a variety of other spring shapes and combinations of spring electrode configurations as described above can be utilized. FIGS. 9-17 illustrate other example springs 260, 262, 264, 266, 268, 270, 272, 274, and 276 that can be utilized with spring electrode configurations and corresponding PCB electrodes as described herein. In different examples and for any of the spring shapes described and contemplated herein, the width and/or thickness of the first and second beams (such as first beam 174 and second beam 180 of FIG. 6) can be modified to correspondingly modify the magnitude of force required to cause a given deflection of the central portion of the spring. Additionally, in other examples a variety of other spring shapes and configurations of spring electrodes and corresponding PCB electrodes can be utilized. Such other examples include, but are not limited to, a Y-shaped spring with three spring electrodes equally-spaced from a central portion, and a circular spring with a plurality of spring electrodes equally-spaced from a central portion.

With reference now to FIGS. 18-23B, an example of touchpad 120 that utilizes another configuration of springs, spring electrodes and PCB electrodes is now presented. Like the example described above, touchpad 120 includes a cover glass layer 140 affixed to a PCB 344 by an adhesive layer 146. The PCB 344 is supported by a plurality of springs 300 located on base plate 154. In this example, the touchpad 120 utilizes four springs 300 to support the PCB 344 and provide capacitive force sensing as described further below.

With reference to the simplified cross section illustrated in FIG. 20, and as described in more detail below, each spring 300 comprises a central portion 304 that is resiliently supported by two beams extending from opposing internal walls of the spring. A spacer 308 is located between the central portion 304 and a lower metal layer 164 of the PCB 344 and is bonded to the central portion and/or the PCB 344. Like the other examples described herein, the spacer 308 comprises a silicone bump that includes an embedded conductive bead that provides grounding of the spring 300 to facilitate capacitive measurements.

Figure 19:
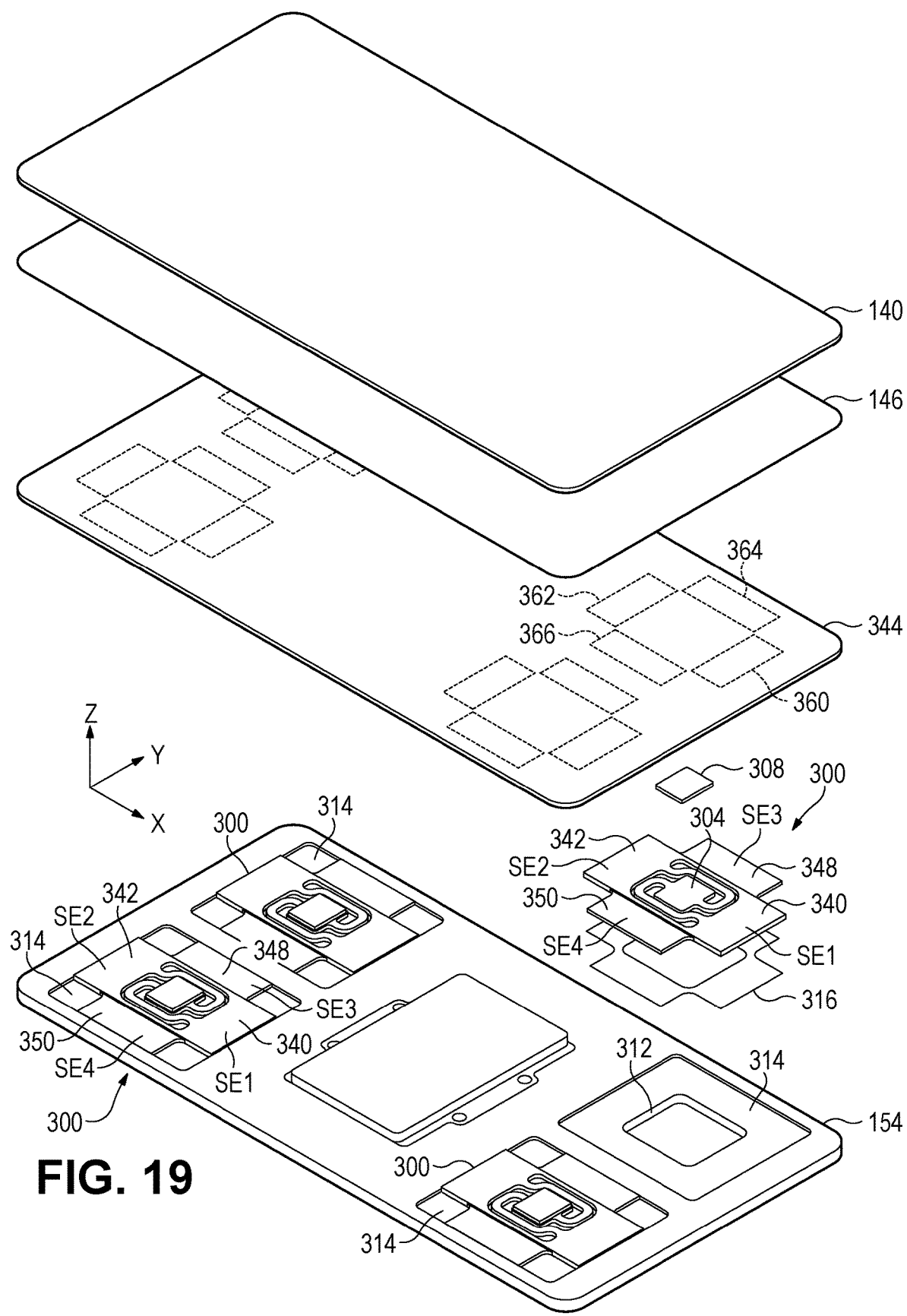
FIG. 19 shows an exploded view of the touchpad of FIG. 18.

In this example the base plate 154 defines four apertures 312 that each correspond to one of the springs 300. As shown in FIGS. 19 and 20, at each aperture 312 the base plate 154 comprises a recessed shelf 314 that surrounds the aperture. A spring 300 is affixed to the recessed shelf 314 of the base plate 154 via a spring adhesive layer 316. As best seen in FIGS. 20 and 22, the central portion 304 of the spring 300 is positioned over a corresponding aperture 312 in the base plate 154. In this manner, each spring 150 resiliently supports the PCB 344 in a manner that enables the PCB to move in the z-axis direction in response to a force exerted on the cover glass layer 140.

With reference to FIG. 21, in this example and like the examples discussed above, each spring 300 comprises a first beam 320 extending from a first internal wall 322 to a first side 324 of the central portion 304 of the spring. In this example, the first beam 320 initially extends in the negative x-axis direction before curving approximately 180 degrees to extend in the positive x-axis direction into the first side 324 of the central portion 304. Each spring 150 also comprises a second beam 328 extending from a second internal wall 330 opposite the first internal wall 322 to a second side 334 of the central portion 304 opposite to the first side 324. The second beam 328 initially extends in the positive x-axis direction before curving approximately 180 degrees to extend in the negative x-axis direction into the second side 334 of the central portion 304.

Like the other examples described herein, each spring 300 comprises a plurality of spring electrodes within the footprint of the spring structure, with each spring electrode being spaced from an overlying PCB electrode located on the PCB 344 to enable capacitive force sensing utilizing displacements of the PCB 344. In the present example and with reference to FIGS. 20, 21 and 23A, each spring 300 comprises a first spring electrode 340 (SE1) located on the first side 324 of the central portion 304 of the spring, and a second spring electrode 342 (SE2) located on the second side 334 of the central portion 304 of the spring that is opposite to the first side. With reference to FIGS. 19 and 20, in this example the first spring electrode 340 (SE1) and the second spring electrode 342 (SE2) are affixed to the recessed shelf 314 of the base plate 154 via adhesive layer 316.

Figure 23A:
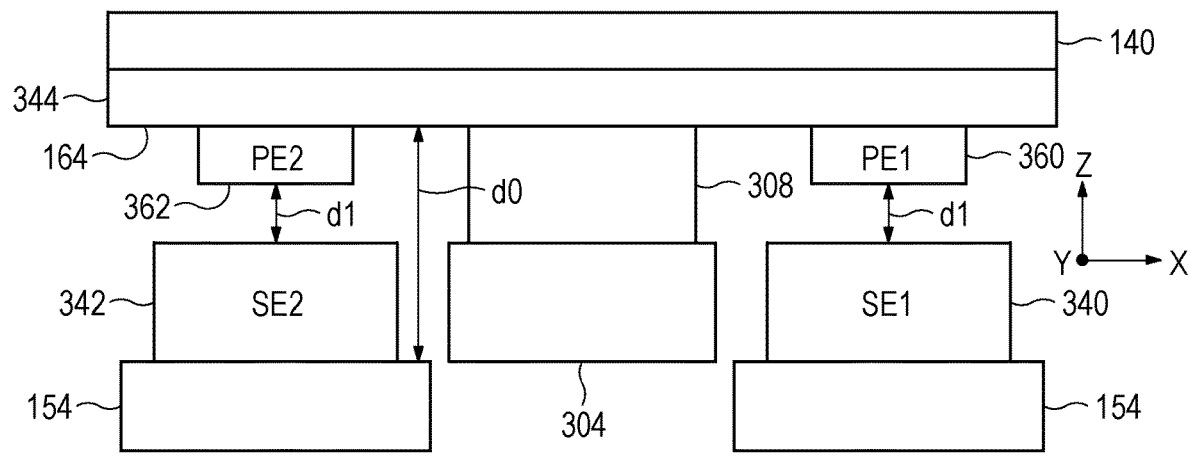
FIG. 23A is a simplified depiction of the cross section of FIG. 20.
Figure 23B:
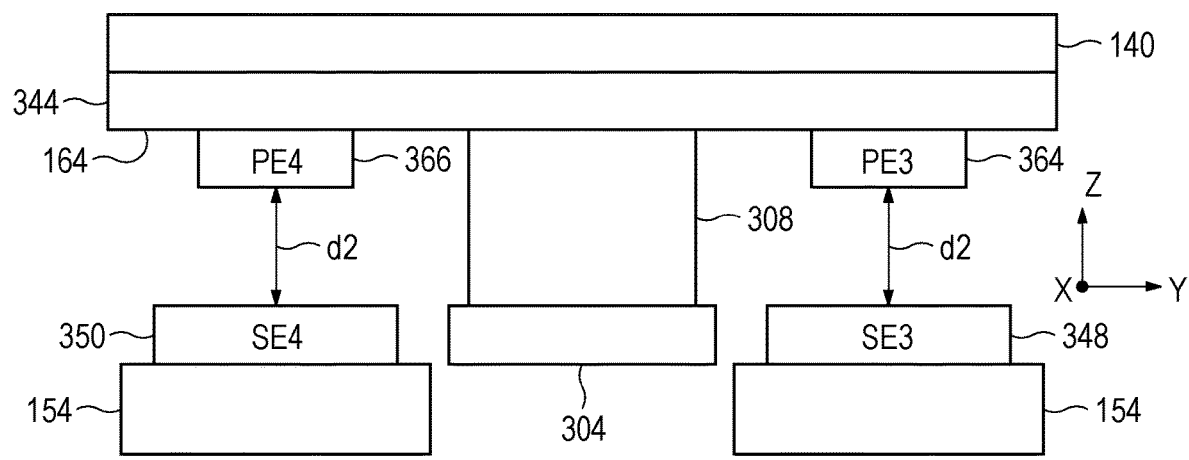
FIG. 23B is a simplified depiction of the cross section of FIG. 22.

In this example and with reference to FIGS. 21, 22, and 23B, each spring 300 also comprises a third spring electrode 348 (SE3) located on a third side 325 of the central portion 304 of the spring between the first side 322 and second side 324, and a fourth spring electrode 350 (SE4) located on a fourth side 326 of the central portion 304 of the spring that is opposite to the third side 325 and between the first side 322 and second side 324. With reference to FIGS. 19 and 22, in this example the third spring electrode 348 (SE3) and the fourth spring electrode 350 (SE4) are also affixed to the recessed shelf 314 of the base plate 154 via adhesive layer 316.

Advantageously, by affixing the first spring electrode 340 (SE1), second spring electrode 342 (SE2), third spring electrode 348 (SE3), and fourth spring electrode 350 (SE4) to the recessed shelf 314 of the base plate 154, and supporting the PCB 344 at the central portion 304 of the spring 300 that is interior to the four spring electrodes, bending errors between the PCB electrodes and the spring electrodes are reduced or substantially eliminated. Additionally, this configuration also reduces the required packaging space required by combining the spring electrodes and resilient spring structures in the same footprint of the spring.

Additionally, in another potential advantage of this example, the first spring electrode 340 (SE1), second spring electrode 342 (SE2), third spring electrode 348 (SE3), and fourth spring electrode 350 (SE4) are integral portions of the spring 300. Alternatively expressed and like the example described above, the spring 300 and each of its components are fabricated from one continuous workpiece of material, such as copper. In different examples, spring 300 can be fabricated via metalworking processes, additive manufacturing processes, or any other suitable process. As noted above, in one potential advantage of this configuration, providing these four spring electrodes as integral portions of the spring 300 advantageously enables a "bucket-less" design that does not utilize or require the structural rigidity of a metal bucket. This configuration also reduces the tolerance chain between these spring electrodes and corresponding PCB electrodes on the PCB 344 as described further below.

In other examples, the first spring electrode 340 (SE1), second spring electrode 342 (SE2), third spring electrode 348 (SE3), and fourth spring electrode 350 (SE4) can be separate components that are affixed to the spring 300.

As with the examples described above, the PCB 344 includes a plurality of PCB electrodes that are each spaced from and overlying one of the spring electrodes of the spring 300. In the present example and with reference to FIGS. 19, 20 and 23A, a first PCB electrode 360 (PE1) is located a first distance d1 from the first spring electrode 340 (SE1), and a second PCB electrode 362 (PE2) is located the same first distance d1 from the second spring electrode 342 (SE2). With reference now to FIGS. 19, 22 and 23B, a third PCB electrode 364 (PE3) is located a second distance d2 from the third spring electrode 348 (SE3), and a fourth PCB electrode 366 (PE4) is located the same second distance d2 from the fourth spring electrode 350 (SE4).

As best seen in FIG. 19 and the schematic cross-sections of FIGS. 23A and 23B, in this example the third spring electrode 348 (SE3) and fourth spring electrode 350 (SE4) are stepped down in the z-axis direction with respect to the first spring electrode 340 (SE1) and second spring electrode 342 (SE2). In this manner, the second distance d2 between the third PCB electrode 364 (PE3) and the third spring electrode 348 (SE3) and between the fourth PCB electrode 366 (PE4) and the fourth spring electrode 350 (SE4) is greater than the first distance d1 between the first PCB electrode 360 (PE1) and the first spring electrode 340 (SE1) and between the second PCB electrode 362 (PE2) and the second spring electrode 342 (SE2). With this configuration, because the first distance d1 is different from the second distance d2, a cross-capacitance differential capacitive force sensing technique can be utilized that advantageously corrects for bending errors along both the x-axis and the y-axis directions. This differential capacitance between the four pairs of electrodes can be used to calibrate a base height do between the PCB 344 and the base plate 154 of the touchpad over the life of the touchpad and regardless of changes in the base height do from its initial value.

Figure 24:
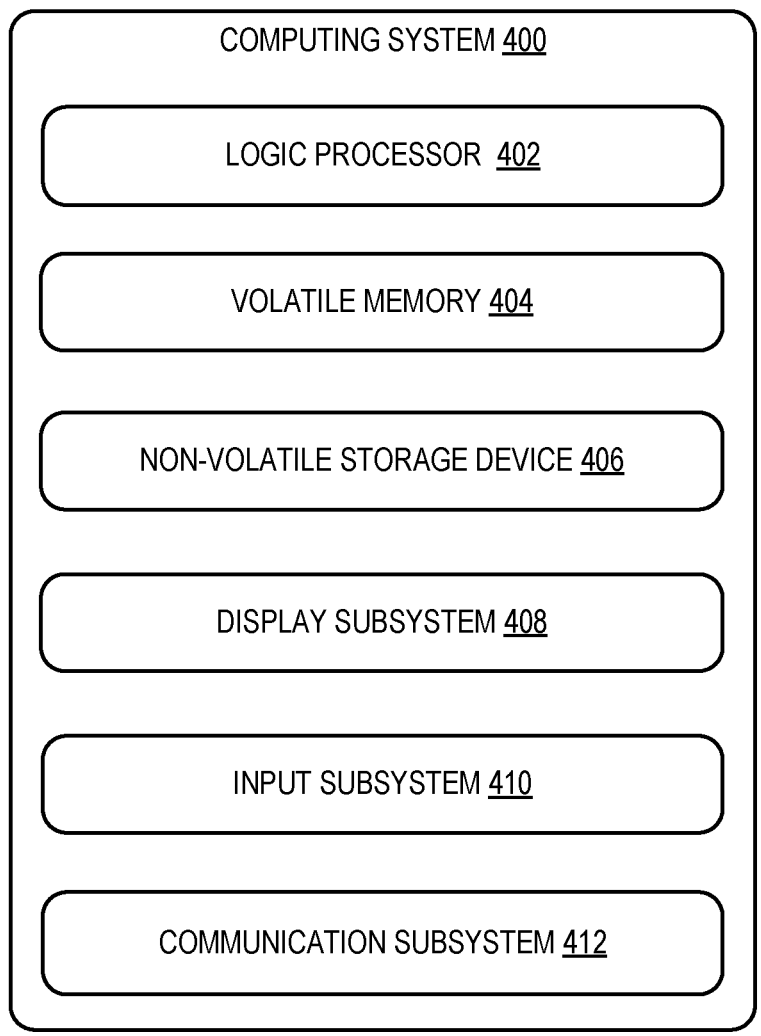
FIG. 24 shows a block diagram of an example computing system according to examples of the present disclosure.

In some embodiments, the touchpads and components described herein may utilized with a computing system of one or more computing devices. FIG. 24 schematically shows a non-limiting embodiment of a computing system 400 in which the touchpads described above may be utilized. Computing system 400 is shown in simplified form. Computing system 400 may take the form of one or more laptops, personal computers, server computers, tablet computers, home-entertainment computers, gaming devices, mobile computing devices, mobile communication devices (e.g., smart phone), wearable computing devices, and/or other computing devices. The laptop computing device 100 described above may comprise computing system 400 or one or more aspects of computing system 400.

Computing system 400 includes a logic processor 402, volatile memory 404, and a non-volatile storage device 406. Computing system 400 may optionally include a display subsystem 408, input subsystem 410, communication subsystem 412, and/or other components not shown in FIG. 24.

Logic processor 402 includes one or more physical devices configured to execute instructions. For example, the logic processor may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 402 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Volatile memory 404 may include physical devices that include random access memory (RAM). Volatile memory 404 is typically utilized by logic processor 402 to temporarily store information during processing of software instructions. It will be appreciated that volatile memory 404 typically does not continue to store instructions when power is cut to the volatile memory 404.

Non-volatile storage device 406 includes one or more physical devices configured to hold instructions executable by the logic processors to implement the methods and processes described herein. When such methods and processes are implemented, the state of non-volatile storage device 406 may be transformed—e.g., to hold different data.

Non-volatile storage device 406 may include physical devices that are removable and/or built-in. Non-volatile storage device 406 may include optical memory (e.g., CD, DVD, HD-DVD, Blu-Ray Disc, etc.), semiconductor memory (e.g., ROM, EPROM, EEPROM, FLASH memory, etc.), magnetic memory (e.g., hard-disk drive, floppy-disk drive, tape drive, MRAM, etc.), and/or other mass storage device technology. Non-volatile storage device 406 may include nonvolatile, dynamic, static, read/write, read-only, sequential-access, location-addressable, file-addressable, and/or content-addressable devices. It will be appreciated that non-volatile storage device 406 is configured to hold instructions even when power is cut to the non-volatile storage device 406.

Aspects of logic processor 402, volatile memory 404, and non-volatile storage device 406 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 408 may be used to present a visual representation of data held by non-volatile storage device 406. As the herein described methods and processes change the data held by the non-volatile storage device, and thus transform the state of the non-volatile storage device, the state of display subsystem 408 may likewise be transformed to visually represent changes in the underlying data. Display subsystem 408 may include one or more display devices utilizing virtually any type of technology. Such display devices may be combined with logic processor 402, volatile memory 404, and/or non-volatile storage device 406 in a shared enclosure, or such display devices may be peripheral display devices.

Input subsystem 410 may comprise or interface with one or more user-input devices such as touchpad 120, keyboard 124, touch screen display 104, a mouse, electronic pen, stylus, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 412 may be configured to communicatively couple various computing devices described herein with each other, and with other devices. Communication subsystem 412 may include wired and/or wireless communication devices compatible with one or more different communication protocols. As non-limiting examples, the communication subsystem may be configured for communication via a wireless telephone network, or a wired or wireless local- or wide-area network, such as an HDMI over Wi-Fi connection. In some embodiments, the communication subsystem may allow computing system 400 to send and/or receive messages to and/or from other devices via a network such as the Internet.

The following paragraphs provide additional support for the claims of the subject application. One aspect provides a force sensing touchpad for a computing device, the force sensing touchpad comprising: a printed circuit board (PCB) comprising a plurality of PCB electrodes; a base plate spaced from the PCB and defining an aperture; a spring mounted on the base plate and overlying the aperture in the base plate, the spring comprising: a plurality of spring electrodes; a first beam extending from a first internal wall to a first side of a central portion that overlies the aperture; and a second beam extending from a second internal wall that is opposite the first internal wall to a second side of the central portion that is opposite to the first side; and a spacer located between the PCB and the central portion of the spring, wherein each of the PCB electrodes is spaced from and overlies one of the spring electrodes of the spring. The force sensing touchpad may additionally or alternatively include, wherein the plurality of spring electrodes are an inner rectangular spring electrode and an outer rectangular spring electrode surrounding the inner rectangular spring electrode. The force sensing touchpad may additionally or alternatively include, wherein the base plate comprises a recessed shelf surrounding the aperture, and the inner rectangular spring electrode and the outer rectangular spring electrode are affixed to the recessed shelf. The force sensing touchpad may additionally or alternatively include, wherein the inner rectangular spring electrode and the outer rectangular spring electrode are integral portions of the spring. The force sensing touchpad may additionally or alternatively include, wherein the plurality of PCB electrodes comprise an inner rectangular PCB electrode and an outer rectangular PCB electrode surrounding the inner rectangular PCB electrode, and an inner distance between the inner rectangular spring electrode and the inner rectangular PCB electrode is different from an outer distance between the outer rectangular spring electrode and the outer rectangular PCB electrode. The force sensing touchpad may additionally or alternatively include, wherein the plurality of spring electrodes are a first spring electrode on a first side of the spring and a second spring electrode on a second side of the spring opposite to the first side, the second spring electrode being coplanar with the first spring electrode. The force sensing touchpad may additionally or alternatively include, wherein the spring is rectangular and the plurality of spring electrodes are a first spring electrode extending along a first side and an adjoining third side of the spring and a second spring electrode extending along a second side and an adjoining fourth side of the spring. The force sensing touchpad may additionally or alternatively include, wherein the plurality of spring electrodes are: a first spring electrode (SE1) located on a first side of the central portion of the spring, the first spring electrode (SE1) located a first distance d1 from a first PCB electrode (PE1) of the plurality of PCB electrodes; a second spring electrode (SE2) located on a second side of the central portion of the spring that is opposite to the first side, the second spring electrode (SE2) located the first distance d1 from a second PCB electrode (PE2) of the plurality of PCB electrodes; a third spring electrode (SE3) located on a third side of the central portion of the spring, the third spring electrode (SE3) located a second distance d2 from a third PCB electrode (PE3) of the plurality of PCB electrodes, wherein d2 is greater than d1; and a fourth spring electrode (SE4) located on a fourth side of the central portion of the spring that is opposite to the third side, the fourth spring electrode (SE4) located the second distance d2 from a fourth PCB electrode (PE4) of the plurality of PCB electrodes. The force sensing touchpad may additionally or alternatively include, wherein the first spring electrode (SE1), second spring electrode (SE2), third spring electrode (SE3), and fourth spring electrode (SE4) are integral portions of the spring. The force sensing touchpad may additionally or alternatively include, wherein the base plate comprises a recessed shelf surrounding the aperture, and the first spring electrode (SE1), second spring electrode (SE2), third spring electrode (SE3), and fourth spring electrode (SE4) are affixed to the recessed shelf.

Another aspect provides computing device comprising a force sensing touchpad, the force sensing touchpad comprising: a printed circuit board (PCB) comprising a plurality of PCB electrodes; a base plate spaced from the PCB and defining an aperture; a spring mounted on the base plate and overlying the aperture in the base plate, the spring comprising: a plurality of spring electrodes; a first beam extending from a first internal wall to a first side of a central portion that overlies the aperture; and a second beam extending from a second internal wall that is opposite the first internal wall to a second side of the central portion that is opposite to the first side; and a spacer located between the PCB and the central portion of the spring, wherein each of the PCB electrodes is spaced from and overlies one of the spring electrodes of the spring. The computing device may additionally or alternatively include, wherein the plurality of spring electrodes are an inner rectangular spring electrode and an outer rectangular spring electrode surrounding the inner rectangular spring electrode. The computing device may additionally or alternatively include, wherein the base plate comprises a recessed shelf surrounding the aperture, and the inner rectangular spring electrode and the outer rectangular spring electrode are affixed to the recessed shelf. The computing device may additionally or alternatively include, wherein the inner rectangular spring electrode and the outer rectangular spring electrode are integral portions of the spring. The computing device may additionally or alternatively include, wherein the plurality of PCB electrodes comprise an inner rectangular PCB electrode and an outer rectangular PCB electrode surrounding the inner rectangular PCB electrode, and an inner distance between the inner rectangular spring electrode and the inner rectangular PCB electrode is different from an outer distance between the outer rectangular spring electrode and the outer rectangular PCB electrode. The computing device may additionally or alternatively include, wherein the plurality of spring electrodes are a first spring electrode on a first side of the spring and a second spring electrode on a second side of the spring opposite to the first side, the second spring electrode coplanar with the first spring electrode. The computing device may additionally or alternatively include, wherein the spring is rectangular and the plurality of spring electrodes are a first spring electrode extending along a first side and an adjoining third side of the spring and a second spring electrode extending along a second side and an adjoining fourth side of the spring. The computing device may additionally or alternatively include, wherein the plurality of spring electrodes are: a first spring electrode (SE1) located on a first side of the central portion of the spring, the first spring electrode (SE1) located a first distance d1 from a first PCB electrode (PE1) of the plurality of PCB electrodes; a second spring electrode (SE2) located on a second side of the central portion of the spring that is opposite to the first side, the second spring electrode (SE2) located the first distance d1 from a second PCB electrode (PE2) of the plurality of PCB electrodes; a third spring electrode (SE3) located on a third side of the central portion of the spring, the third spring electrode (SE3) located a second distance d2 from a third PCB electrode (PE3) of the plurality of PCB electrodes, wherein d2 is greater than d1; and a fourth spring electrode (SE4) located on a fourth side of the central portion of the spring that is opposite to the third side, the fourth spring electrode (SE4) located the second distance d2 from a fourth PCB electrode (PE4) of the plurality of PCB electrodes. The computing device may additionally or alternatively include, wherein the first spring electrode (SE1), second spring electrode (SE2), third spring electrode (SE3), and fourth spring electrode (SE4) are integral portions of the spring.

Another aspect provides a force sensing touchpad for a computing device, the force sensing touchpad comprising: a printed circuit board (PCB) comprising a plurality of PCB electrodes; a base plate spaced from the PCB and defining an aperture; a spring mounted on the base plate and overlying the aperture in the base plate, the spring comprising: a first beam extending from a first internal wall to a first side of a central portion that overlies the aperture; a second beam extending from a second internal wall that is opposite the first internal wall to a second side of the central portion that is opposite to the first side; a first spring electrode (SE1) located on a first side of the central portion of the spring, the first spring electrode (SE1) located a first distance d1 from a first PCB electrode (PE1) of the plurality of PCB electrodes; a second spring electrode (SE2) located on a second side of the central portion of the spring that is opposite to the first side, the second spring electrode (SE2) located the first distance d1 from a second PCB electrode (PE2) of the plurality of PCB electrodes; a third spring electrode (SE3) located on a third side of the central portion of the spring, the third spring electrode (SE3) located a second distance d2 from a third PCB electrode (PE3) of the plurality of PCB electrodes, wherein d2 is greater than d1; and a fourth spring electrode (SE4) located on a fourth side of the central portion of the spring that is opposite to the third side, the fourth spring electrode (SE4) located the second distance d2 from a fourth PCB electrode (PE4) of the plurality of PCB electrodes; wherein the first spring electrode (SE1), second spring electrode (SE2), third spring electrode (SE3), and fourth spring electrode (SE4) are integral portions of the spring; wherein the base plate comprises a recessed shelf surrounding the aperture, and the first spring electrode (SE1), second spring electrode (SE2), third spring electrode (SE3), and fourth spring electrode (SE4) are affixed to the recessed shelf; and a spacer located between the PCB and the central portion of the spring.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A capacitive force sensing touchpad for a computing device, the capacitive force sensing touchpad comprising:
   a printed circuit board (PCB) comprising a plurality of PCB electrodes;
   a base plate spaced from the PCB and defining an aperture;
   a spring mounted on the base plate and overlying the aperture in the base plate, the spring comprising:
      a plurality of spring electrodes located on the spring;
      a first beam extending from a first internal wall to a first side of a central portion that overlies the aperture; and
      a second beam extending from a second internal wall that is opposite the first internal wall to a second side of the central portion that is opposite to the first side; and
   a spacer located between the PCB and the central portion of the spring,
   wherein each of the PCB electrodes is spaced from and overlies one of the spring electrodes located on the spring to provide capacitive force sensing via the PCB electrodes and the spring electrodes.

2. The force sensing touchpad of claim 1, wherein the plurality of spring electrodes are an inner rectangular spring electrode and an outer rectangular spring electrode surrounding the inner rectangular spring electrode.

3. The force sensing touchpad of claim 2, wherein the base plate comprises a recessed shelf surrounding the aperture, and the inner rectangular spring electrode and the outer rectangular spring electrode are affixed to the recessed shelf.

4. The force sensing touchpad of claim 2, wherein the inner rectangular spring electrode and the outer rectangular spring electrode are integral portions of the spring.

5. The force sensing touchpad of claim 2, wherein the plurality of PCB electrodes comprise an inner rectangular PCB electrode and an outer rectangular PCB electrode surrounding the inner rectangular PCB electrode, and an inner distance between the inner rectangular spring electrode and the inner rectangular PCB electrode is different from an outer distance between the outer rectangular spring electrode and the outer rectangular PCB electrode.

6. The force sensing touchpad of claim 1, wherein the plurality of spring electrodes are a first spring electrode on a first side of the spring and a second spring electrode on a second side of the spring opposite to the first side, the second spring electrode being coplanar with the first spring electrode.

7. The force sensing touchpad of claim 1, wherein the spring is rectangular and the plurality of spring electrodes are a first spring electrode extending along a first side and an adjoining third side of the spring and a second spring electrode extending along a second side and an adjoining fourth side of the spring.

8. The force sensing touchpad of claim 1, wherein the plurality of spring electrodes are:
   a first spring electrode (SE1) located on a first side of the central portion of the spring, the first spring electrode (SE1) located a first distance d1 from a first PCB electrode (PE1) of the plurality of PCB electrodes;

a second spring electrode (SE2) located on a second side of the central portion of the spring that is opposite to the first side, the second spring electrode (SE2) located the first distance d1 from a second PCB electrode (PE2) of the plurality of PCB electrodes;

a third spring electrode (SE3) located on a third side of the central portion of the spring, the third spring electrode (SE3) located a second distance $d_2$ from a third PCB electrode (PE3) of the plurality of PCB electrodes, wherein $d_2$ is greater than $d_1$; and a fourth spring electrode (SE4) located on a fourth side of the central portion of the spring that is opposite to the third side, the fourth spring electrode (SE4) located the second distance $d_2$ from a fourth PCB electrode (PE4) of the plurality of PCB electrodes.

9. The force sensing touchpad of claim 8, wherein the first spring electrode (SE1), second spring electrode (SE2), third spring electrode (SE3), and fourth spring electrode (SE4) are integral portions of the spring.

10. The force sensing touchpad of claim 8, wherein the base plate comprises a recessed shelf surrounding the aperture, and the first spring electrode (SE1), second spring electrode (SE2), third spring electrode (SE3), and fourth spring electrode (SE4) are affixed to the recessed shelf.

11. A computing device comprising a capacitive force sensing touchpad, the capacitive force sensing touchpad comprising:

a printed circuit board (PCB) comprising a plurality of PCB electrodes;

a base plate spaced from the PCB and defining an aperture;

a spring mounted on the base plate and overlying the aperture in the base plate, the spring comprising:
 a plurality of spring electrodes located on the spring;
 a first beam extending from a first internal wall to a first side of a central portion that overlies the aperture; and
 a second beam extending from a second internal wall that is opposite the first internal wall to a second side of the central portion that is opposite to the first side; and a spacer located between the PCB and the central portion of the spring, wherein each of the PCB electrodes is spaced from and overlies one of the spring electrodes located on the spring to provide capacitive force sensing via the PCB electrodes and the spring electrodes.

12. The computing device of claim 11, wherein the plurality of spring electrodes are an inner rectangular spring electrode and an outer rectangular spring electrode surrounding the inner rectangular spring electrode.

13. The computing device of claim 12, wherein the base plate comprises a recessed shelf surrounding the aperture, and the inner rectangular spring electrode and the outer rectangular spring electrode are affixed to the recessed shelf.

14. The computing device of claim 12, wherein the inner rectangular spring electrode and the outer rectangular spring electrode are integral portions of the spring.

15. The computing device of claim 12, wherein the plurality of PCB electrodes comprise an inner rectangular PCB electrode and an outer rectangular PCB electrode surrounding the inner rectangular PCB electrode, and an inner distance between the inner rectangular spring electrode and the inner rectangular PCB electrode is different from an outer distance between the outer rectangular spring electrode and the outer rectangular PCB electrode.

16. The computing device of claim 11, wherein the plurality of spring electrodes are a first spring electrode on a first side of the spring and a second spring electrode on a second side of the spring opposite to the first side, the second spring electrode coplanar with the first spring electrode.

17. The computing device of claim 11, wherein the spring is rectangular and the plurality of spring electrodes are a first spring electrode extending along a first side and an adjoining third side of the spring and a second spring electrode extending along a second side and an adjoining fourth side of the spring.

18. The computing device of claim 11, wherein the plurality of spring electrodes are:

a first spring electrode (SE1) located on a first side of the central portion of the spring, the first spring electrode (SE1) located a first distance d1 from a first PCB electrode (PE1) of the plurality of PCB electrodes;

a second spring electrode (SE2) located on a second side of the central portion of the spring that is opposite to the first side, the second spring electrode (SE2) located the first distance $d_1$ from a second PCB electrode (PE2) of the plurality of PCB electrodes;

a third spring electrode (SE3) located on a third side of the central portion of the spring, the third spring electrode (SE3) located a second distance $d_2$ from a third PCB electrode (PE3) of the plurality of PCB electrodes, wherein $d_2$ is greater than $d_1$; and a fourth spring electrode (SE4) located on a fourth side of the central portion of the spring that is opposite to the third side, the fourth spring electrode (SE4) located the second distance $d_2$ from a fourth PCB electrode (PE4) of the plurality of PCB electrodes.

19. The computing device of claim 18, wherein the first spring electrode (SE1), second spring electrode (SE2), third spring electrode (SE3), and fourth spring electrode (SE4) are integral portions of the spring.

20. A force sensing touchpad for a computing device, the force sensing touchpad comprising:

a printed circuit board (PCB) comprising a plurality of PCB electrodes;

a base plate spaced from the PCB and defining an aperture;

a spring mounted on the base plate and overlying the aperture in the base plate, the spring comprising:
 a first beam extending from a first internal wall to a first side of a central portion that overlies the aperture;
 a second beam extending from a second internal wall that is opposite the first internal wall to a second side of the central portion that is opposite to the first side;
 a first spring electrode (SE1) located on a first side of the central portion of the spring, the first spring electrode (SE1) located a first distance $d_1$ from a first PCB electrode (PE1) of the plurality of PCB electrodes;
 a second spring electrode (SE2) located on a second side of the central portion of the spring that is opposite to the first side, the second spring electrode (SE2) located the first distance $d_1$ from a second PCB electrode (PE2) of the plurality of PCB electrodes;
 a third spring electrode (SE3) located on a third side of the central portion of the spring, the third spring electrode (SE3) located a second distance $d_2$ from a third PCB electrode (PE3) of the plurality of PCB electrodes, wherein $d_2$ is greater than $d_1$; and a fourth spring electrode (SE4) located on a fourth side of the central portion of the spring that is opposite to the third side, the fourth spring electrode (SE4) located the second distance $d_2$ from a fourth PCB electrode (PE4) of the plurality of PCB electrodes;

wherein the first spring electrode (SE1), second spring electrode (SE2), third spring electrode (SE3), and fourth spring electrode (SE4) are integral portions of the spring;

wherein the base plate comprises a recessed shelf surrounding the aperture, and the first spring electrode (SE1), second spring electrode (SE2), third spring electrode (SE3), and fourth spring electrode (SE4) are affixed to the recessed shelf, and a spacer located between the PCB and the central portion of the spring.

* * * * *